United States Patent [19]
Bourekas et al.

[11] Patent Number: 5,894,176
[45] Date of Patent: Apr. 13, 1999

[54] FLEXIBLE RESET SCHEME SUPPORTING NORMAL SYSTEM OPERATION, TEST AND EMULATION MODES

[75] Inventors: Philip A. Bourekas, San Jose; Avigdor Willenz, Campbell; Yeshayahu Mor, Cupertino, all of Calif.

[73] Assignee: Integrated Device Technology, Inc., Santa Clara, Calif.

[21] Appl. No.: 08/238,192

[22] Filed: May 4, 1994

Related U.S. Application Data

[63] Continuation of application No. 08/070,007, May 28, 1993, abandoned, which is a continuation of application No. 07/715,523, Jun. 14, 1991, abandoned.

[51] Int. Cl.⁶ ............................................. H03K 3/02
[52] U.S. Cl. ............................................. 327/198; 327/415
[58] Field of Search ............................ 307/530, 244; 327/51, 415, 198, 185; 326/56

[56] References Cited

U.S. PATENT DOCUMENTS

| | | | |
|---|---|---|---|
| 3,917,960 | 11/1975 | Kane | 327/185 |
| 4,518,865 | 5/1985 | Iwasaki | 327/185 |
| 4,518,960 | 5/1985 | Clark | 307/244 |
| 4,743,842 | 5/1988 | Langone et al. | 326/56 |
| 4,746,818 | 5/1988 | Hafner | 326/56 |
| 4,801,825 | 1/1989 | Stanley et al. | 326/56 |
| 5,023,487 | 6/1991 | Wellheuser et al. | 326/56 |
| 5,029,136 | 7/1991 | Tran et al. | 307/530 |
| 5,034,636 | 7/1991 | Reis et al. | 307/530 |
| 5,036,231 | 7/1991 | Kanabara | 307/530 |
| 5,039,059 | 8/1991 | Ebzery et al. | 327/185 |
| 5,091,660 | 2/1992 | Usami | 307/244 |
| 5,140,178 | 8/1992 | Yoshihara et al. | 327/185 |
| 5,225,723 | 7/1993 | Drake et al. | 326/56 |
| 5,303,350 | 4/1994 | Yu et al. | 327/185 |

OTHER PUBLICATIONS

Fletcher; "An Engineer Approach to Digital Design", 1980, pp. 608–612.

*Primary Examiner*—Terry D. Cunningham
*Attorney, Agent, or Firm*—Skjerven, Morrill, MacPherson, Franklin & Friel

[57] ABSTRACT

A structure and a method are provided to implement a reset scheme for an integrated circuit supporting a variety of testing and debugging equipment. The control and I/O pins of the integrated circuit are each set to a high impedance state when the signals of a reset pin and a mode pin are both asserted. If the signal on the mode pin remains asserted at the time the signal on the reset pin is negated, the control and I/O pins of the integrated circuit remain in the high impedance state until the next time the signal on the reset pin is asserted. Otherwise, the control and I/O pins of the integrated circuits are enabled upon negation of the signal on the reset pin. In one embodiment, the mode pin is multiplexed with an pin used for receiving interrupt signals during functional operation.

9 Claims, 3 Drawing Sheets

FLEXIBLE RESET SCHEME SUPPORTING NORMAL SYSTEM OPERATION, TEST AND EMULATION MODES

This application is a continuation of application Ser. No. 08/070,007, filed May 28, 1993, now abandoned, which is a continuation of 07/715,523, filed Jun. 14, 1991, now abandoned.

FIELD OF THE INVENTION

This invention relates to integrated circuits, and in particular relates to testing integrated circuits.

BACKGROUND OF THE INVENTION

Among methods developed to test a system incorporating a component (e.g. a microprocessor), are the use of an "in-circuit emulator" (ICE), and the use of a "clam-shell" tester. Therefore, it is desirable for the component to provide support features to facilitate the use of these testing methods. For microprocessor-based system designs, support during system reset and immediately after system reset is particularly important. This is because, during and immediately after reset, the microprocessor has very limited information about the environment and must often be responsible for initializing the environment upon its own reset. In the following discussion, the component under test is referred to as the microprocessor under test. However, it will be appreciated by those skilled in the art that the principles discussed below are applicable to testing of many components including those not commonly known as microprocessors.

Normally, when a reset signal is sent to a microprocessor, a sequence of events is triggered over a period of time known as the "reset period." During the reset period, the control output signals of the microprocessor are typically "negated", i.e. driven to the inactive or non-asserted states by the microprocessor, to allow external state machines and control structures to reset at the same time the microprocessor is being reset.

In an ICE testing environment, however, the reset requirements are different. ICE testing is often performed during design time, when the system is not fully debugged. The ICE provides diagnostic facilities beyond that provided by the microprocessor under test. For example, setting up break points, single-stepping etc. are very commonly provided by an ICE. In order to provide real time testing, the microprocessor under test performs much of its normal functions in the system, but is disabled as to certain functions, which are performed by the ICE under auspices of the ICE's extensive diagnostic facilities. Hence, under ICE testing, the microprocessor under test must remain active during most, if not all, of the testing process. Very often, the ICE includes a copy of the chip under test which is known to be functioning properly. During reset, however, when a microprocessor under test resets from its limited knowledge of the environment, both the microprocessor under test and the ICE will attempt to drive the control signals negated, which may be undesirable under certain situations. It is more desirable that, during the period of reset under such situations, the ICE should be given control of the system and the control output signals of the microprocessor under test should remain tristated, i.e. in a high impedance state. After the reset period, however, it is desirable that the microprocessor under test be allowed to perform normal functions.

Clam-shell testing is often used during manufacturing of a board including the microprocessor (i.e. after system design is fully debugged) to inject test patterns for uncovering manufacturing defects, such as an open circuit or a defective part. In clam-shell testing, especially for a surface-mounted microprocessor, the microprocessor is not removed from the system. Instead, the tester "clamps" onto the microprocessor and completely takes over control of the external circuit from the microprocessor. At all times during clam-shell testing, the output terminals of the microprocessor under test must remain inactive, i.e. all the output terminals must be tristated. Therefore, under the clam-shell testing scheme, the microprocessor must remain tristated during and after the reset period. This requirement is in conflict with that needed for supporting ICE testing, as described above.

In the prior art, a microprocessor such as the R3000 available from Integrated Device Technology, Inc. of Santa Clara, Calif., provides support for tristating the microprocessor output pins after reset to support clam-shell type testing. However, no circuit is known to support both ICE and clam-shell testings in the manner discussed above.

SUMMARY OF THE INVENTION

In accordance with the present invention, a structure and a method are provided in a circuit to support various testing techniques both during and after a reset period using a mode pin and a reset pin. Depending upon the signal applied on the mode pin during the reset period, the control output signals of the circuit can be disabled during the reset period. Depending upon the signal on the mode pin at the time the reset period is terminated, the control output signals of the circuit can be disabled for subsequent operations until the next reset period.

In one embodiment, between reset periods, the mode pin is a functional pin performing other functions, such as acting as a pin for receiving an interrupt signal.

In one embodiment, the input and output data signals of the circuit are disabled during the reset period, and depending upon the state of the signal on the mode pin at the time the reset period is terminated, the input and output data signals can be disabled for subsequent operations until the next reset period.

In one embodiment, the reset signal can be asynchronously applied and is synchronized internally with the system clock signal.

Using the reset and mode pins in the manner described above, the present invention provides support for testing and debugging techniques such as clam-shell testing and testing using an in-circuit emulator (ICE).

The present invention is better understood upon consideration of the detailed description below and the accompanying drawings.

DETAILED DESCRIPTION

Figure 1:
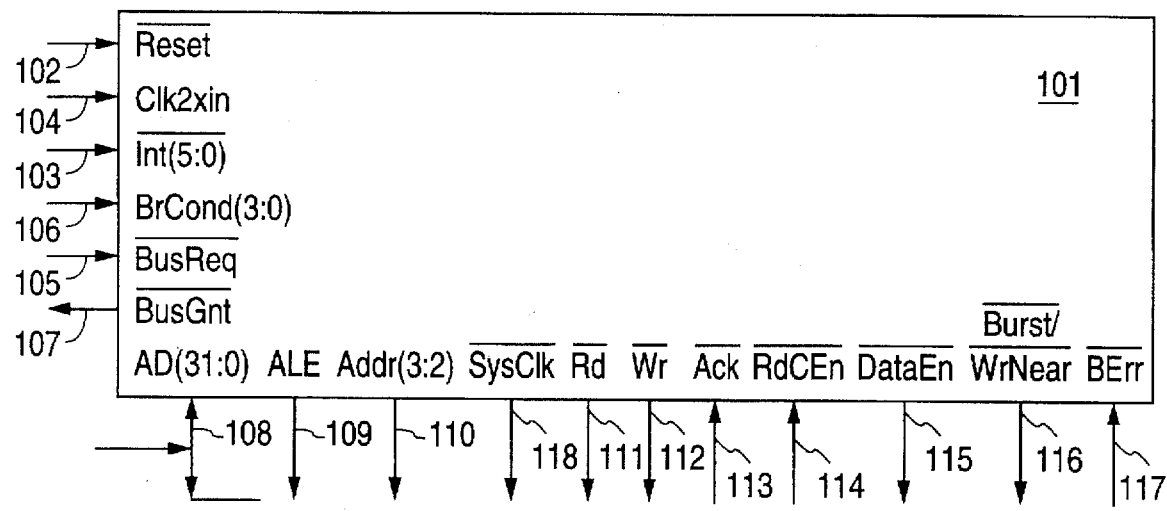
FIG. 1 is a block diagram representation of a microprocessor 101, which is provided with a reset pin 102 and mode pins 103.

FIG. 1 is a block diagram representation of a microprocessor 101. Microprocessor 101 is provided a reset pin 102

Reset, a clock input pin 104 (Clk2xin), a 6-bit interrupt bus 103 ($\overline{Int[5:0]}$), a 4-bit branch condition bus 106 (BrCond [3:0]), bus request pin 105 ($\overline{BusReq}$), and bus grant pin ($\overline{BusGnt}$) 107. In addition, the microprocessor communicates with the main memory system, I/O devices and peripherals over a 32-bit bus 108 (AD[31:0]), using a number of control signal pins 109–118 designated ALE (address latch enable), ADDR[3:2] (lower address bits), $\overline{Rd}$ (read enable), $\overline{Wr}$ (write enable), $\overline{Ack}$ (acknowledgement), $\overline{RdCEn}$ (read clock enable), $\overline{DataEn}$ (data enable) $\overline{Burst/WrNear}$ (burst mode or "write near") and $\overline{BErr}$ (bus error), and clock signal output pin SysClk (system clock). The functions of the control signal pins are discussed in the "IDT79R3051 Family Hardware User's Manual", copyrighted 1990, available from Integrated Device Technology, Inc., Santa Clara, Calif., and which is hereby incorporated by reference in its entirety.

In microprocessor 101, the $\overline{Reset}$ signal on reset pin 102 can be asserted asynchronously from an external circuit (not shown). 3 pins ($\overline{Int[2:0]}$) in the 6-bit interrupt bus 103 are multiplexed as mode pins during the active phase of the $\overline{Reset}$ signal. Under this multiplexing scheme, the signals on pin $\overline{Int[2:0]}$ are sampled at the end of the reset period and the values of these signals are used to select the modes under which the microprocessor 101 operates after the reset period. For example, if the signal (BigEndian) on pin $\overline{Int[0]}$ is at logic high when the $\overline{Reset}$ signal is negated, i.e. transitions from logic low to logic high, the microprocessor 101 operates as a "big endian" microprocessor after reset. Conversely, if the signal on $\overline{Int[0]}$ is at logic low when the $\overline{Reset}$ signal is negated, the microprocessor 101 operates as a "little endian" microprocessor after reset. A person of ordinary skill in the art will appreciate the "little endian" and "big endian" designations as related to ordering of byte addresses in a word. As another example, if the signal (DBlockRefill) on pin $\overline{Int[2]}$ is at logic high when the $\overline{Reset}$ signal is negated, the data cache of microprocessor 101 has a refill block size of four words; otherwise, the data cache of microprocessor 101 has a refill block size of one word. Of course, one of ordinary skill will appreciate the refill block size of a cache memory as related to the number of words the cache memory fetches from the main memory at a time.

In accordance with the present invention, the signal ($\overline{Tristate}$) on pin $\overline{Int[1]}$ is of significance not only upon the negation of the $\overline{Reset}$ signal, but during the reset period as well. During the reset period, while the $\overline{Tristate}$ signal is asserted, i.e. brought to logic low, the output pins of microprocessor 101, except output clock signal pin SysClk, are each set to a high impedance state ("tristated"). Alternatively, during the reset period, while the $\overline{Tristate}$ signal is at logic high, all the control output pins, with the exception of the output clock pin SysClk, are driven to the negated states, and all the input/output signals (e.g. AD[31:0]) are tristated. In addition, if the $\overline{Tristate}$ signal remains at logic low for a sufficient period (see below) prior to the negation of the $\overline{Reset}$ signal, i.e. the $\overline{Reset}$ signal is brought to logic high, the tristated pins will remain tristated until the next reset period. However, if the $\overline{Tristate}$ signal is negated, i.e. brought to logic high, prior to the end of the reset period, the output pins of microprocessor 101 will remain tristated for the remainder of the reset period, but the control output signals of microprocessor 101 will operate normally (i.e. functional) after the $\overline{Reset}$ signal is negated. Although not necessary under ideal conditions, the specification of the present embodiment requires that the $\overline{Tristate}$ signal be held unchanged in the four clock periods preceding the negation of the $\overline{Reset}$ signal, so as to provide sufficient set up time and to avoid noise in the $\overline{Tristate}$ signal which may lead to undesirable results.

Under normal functional operation, during the reset period, the $\overline{Tristate}$ signal is not expected to be asserted, so that the expected behavior of microprocessor 101 during reset is the tristating of input/output signals and the negation of control output signals. However, when testing a board including the microprocessor, using testing techniques such as clam-shell testing or under control of an ICE, while microprocessor 101 is in the reset period, the $\overline{Tristate}$ signal can be asserted to allow the circuit on the board external to the microprocessor 101 to be controlled by the testing device (i.e. the ICE or clam-shell tester) and avoids contention in the control output signals between the device under test (i.e. microprocessor 101) and the testing device. Furthermore, the user can enable the output pins of microprocessor 101 by holding the $\overline{Tristate}$ signal at logic high during the last four SysClk periods prior to the negation of the $\overline{Reset}$ signal, as is desirable when testing in an ICE environment. Alternatively, the user can hold the $\overline{Tristate}$ signal at logic low for the last four SysClk periods prior to the negation of the $\overline{Reset}$ signal, so as to tristate all the output signals of microprocessor 101, as is desirable under clam-shell testing.

Figure 2:
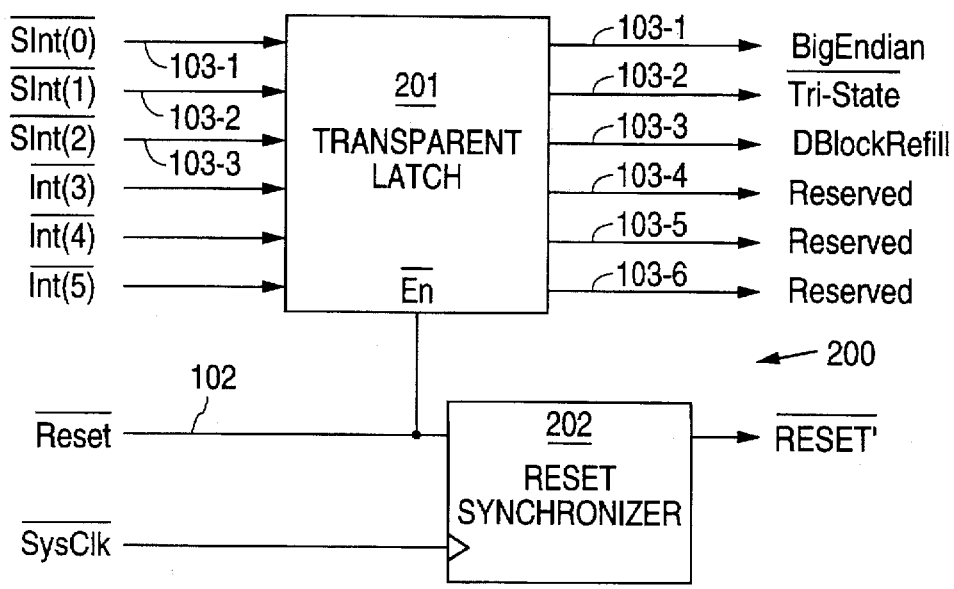
FIG. 2 is a block diagram 200 showing a transparent latch 201 and a reset synchronization circuit 202 in the microprocessor 101 shown in FIG. 1.

In order to implement this reset scheme, the signals of the $\overline{Reset}$ and mode pins are received as shown in FIG. 2. In FIG. 2, the $\overline{Reset}$ signal received on pin 102 (FIG. 1) is synchronized with the output control clock signal $\overline{SysClk}$ of pin 118 in the synchronization circuit 202 and is provided to the central processing unit ("CPU", not shown in FIG. 2) within microprocessor 101. The $\overline{Reset}$ signal is also used to clock transparent latch 201, such that when the $\overline{Reset}$ signal is negated, i.e. $\overline{Reset}$ transitions from logic low to logic high, the transparent latch 201 provides the values of the signals on bus 103 ($\overline{Int[5.0]}$) at the output terminals (103-1' to 103-6') of transparent latch 201. As shown in FIG. 2 the $\overline{Tristate}$ signal is shown at terminal 103-2'. The BigEndian and BlockRefill signals are synchronously received on the pins $\overline{SInt[0]}$ and $\overline{SInt[2]}$ respectively. The remaining pins $\overline{Int[5:3]}$ are not currently used as mode pins for reset. The signals from $\overline{Int[2:0]}$ pins are shown in FIG. 2 as $\overline{SInt[2:0]}$, indicating that the signals on $\overline{Int[2:0]}$ have been synchronized with the $\overline{SysClk}$ signal prior to being provided at transparent latch 201.

In the present embodiment, the negation of the synchronized $\overline{Reset}$ signal is received at the CPU after two $\overline{SysClk}$ cycles. The CPU then performs "house-keeping" tasks, such as reinitializing the instruction fetch pipelines, before branching to the reset exception handling service routine specified by the reset exception vector. The reset exception vector resides in unmapped and uncacheable memory space, so as to allow the reset exception be handled even though the cache memory and the virtual memory systems may be in an undefined state. The reset service routine initializes the CPU's internal states and boot-straps the operating system.

Figure 3:
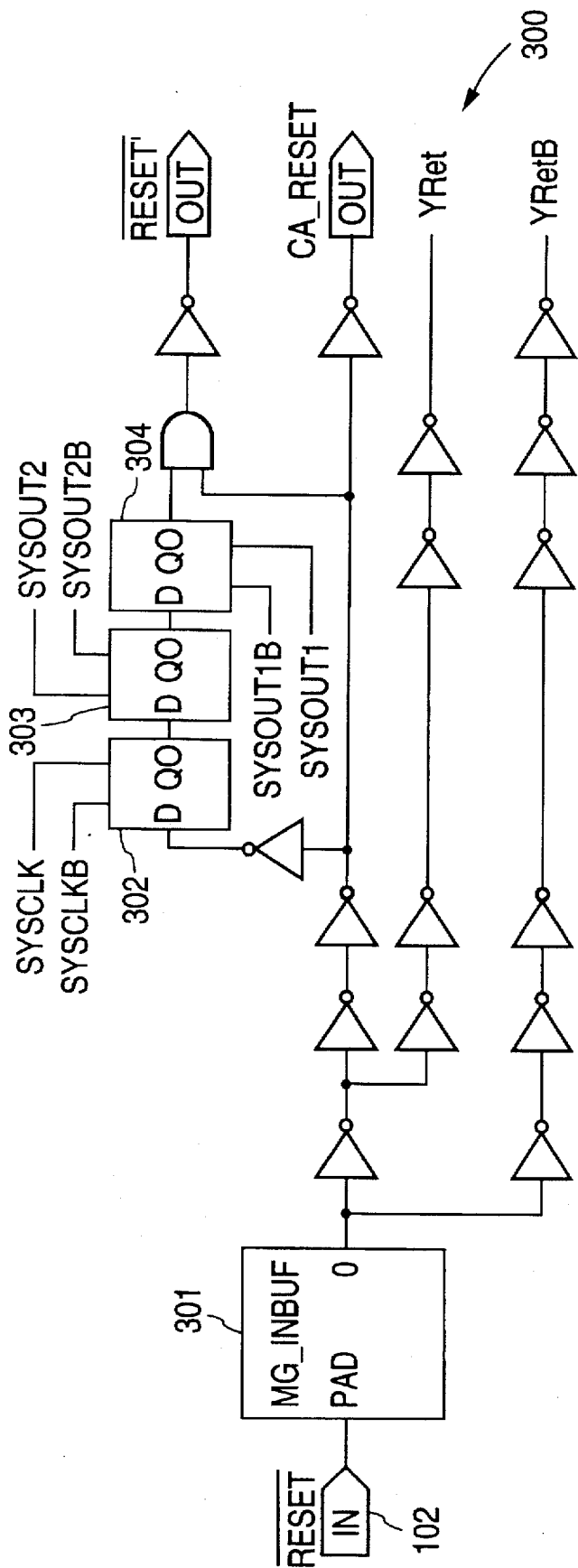
FIG. 3 shows a circuit 300 suitable for implementing the reset synchronization circuit 202 of FIG. 2.

FIG. 3 shows a circuit 300 receiving the $\overline{Reset}$ signal 102 of FIG. 2. As shown in FIG. 3, the $\overline{Reset}$ signal is first received on an input buffer 301 of pin 102. From input buffer 301, the $\overline{Reset}$ signal is amplified for distribution throughout the chip by a number of inverting amplifiers. As shown in FIG. 3, three asynchronous signals YRet, YRetB, and CA_RESET are generated. YRet and YRetB are complementary signals suitable for use as complementary clocking signals. In addition, a signal $\overline{Reset}$' is also provided. As shown in FIG. 3, with respect to logic low to logic high transitions of the $\overline{Reset}$ signal (i.e. negation of reset) signal $\overline{Reset}$' is synchronized by the latches 302, 303 and 304, respectively controlled by three sets of complementary clock signals. Signal $\overline{Reset}$' is asynchronous with respect to logic high to logic low transitions of the $\overline{Reset}$ signal (i.e. onset of reset). Thus, signal $\overline{\text{Reset}}'$ can be used to provide an asynchronous qualified $\overline{\text{Reset}}$ signal at the beginning of the reset period, and a synchronous qualified $\overline{\text{Reset}}$ signal at the end of the reset period. $\overline{\text{Reset}}'$ satisfies the reset timing requirements of the CPU.

Figure 4:
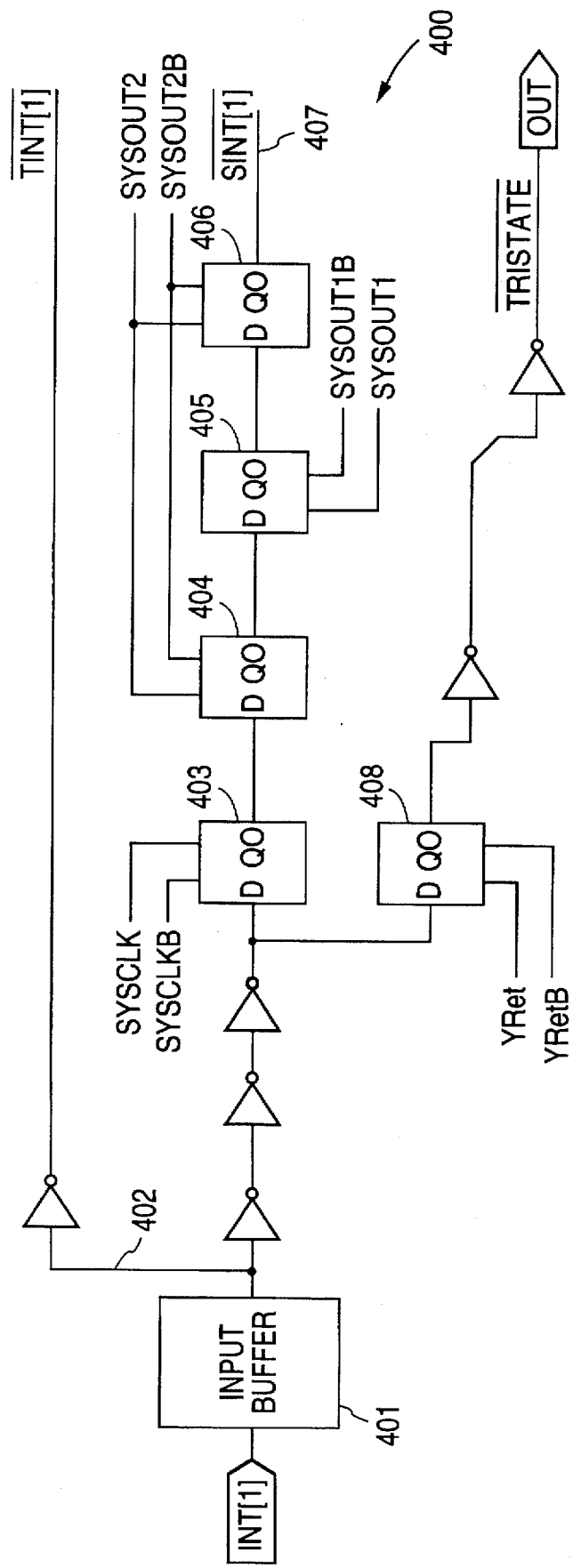
FIG. 4 shows a circuit 400 which generates the signals $\overline{SInt}[2:0]$ associated with the interrupt pins labelled $\overline{SInt}[2:0]$ and one of the $\overline{Tristate}$, BigEndian and DBlockRefill signals shown in FIG. 2, in response to the $\overline{Reset}$ signal received.

FIG. 4 is structure suitable for implementing a circuit for generating one of the signals $\overline{\text{SInt}}[2:0]$ on one of the interrupt pins labelled $\overline{\text{SInt}}[2:0]$. As shown in FIG. 4, an input buffer 401 receives the signal from the associated pin, for example, pin $\overline{\text{Int}}[1]$. An inverted asynchronous signal is provided on lead 402, which is one bit of bus $\overline{\text{TINT}}$. This inverted asynchronous signal on lead 402 is routed to circuits (not shown) which receive the interrupt signal asynchronously. During functional operations, i.e. when not in the reset period, the signal received in input buffer 401 is synchronized, after suitable buffering, by the flip-flops 403–406, each of which being controlled by a pair of complementary clock signal. The synchronized signal appears on terminal 407 The synchronized signal $\overline{\text{SInt}}[1]$ on terminal 407 satisfies the timing requirements of the CPU core. However, as mentioned above, the $\overline{\text{Int}}[1]$ pin is multiplexed as a mode pin during the reset period. At the negation of reset, the complementary clock signals YRet and YRetB, which are generated in response to the $\overline{\text{Reset}}$ signal discussed above in conjunction with FIG. 3, latch the value of the signal received in input buffer 401 into transparent latch 408. Since the signals YRet and YRetB change state only when the $\overline{\text{Reset}}$ signal changes state, the value latched into latch 408 will be held until the next reset period. As shown, the signal latched into latch 408 becomes the Tristate signal described above after suitable buffering for distribution. The signals BigEndian and DBlockIRefill are generated similarly.

The above detailed description is provided to illustrate the specific embodiments provided above, and not intended to be limiting the present inventions. Many modifications and variations within the scope of the present invention are possible. The present invention is defined by the following claims.

We claim:

1. In a logic circuit having a plurality of output control signals and a plurality of input/output signals, a reset circuit comprising:

a first input means for receiving a reset signal having an asserted state and a negated state;

a second input means for receiving a mode signal having an asserted and a negated state; and a circuit, coupled to receive said reset signal and said mode signal, for generating a first control signal to force each of said output control signals to a negated state and a second control signal for causing said input/output signals to be tristated, such that (i) when said reset signal is in said asserted state and said mode signal is in said asserted state, said first control signal is asserted to force each of said output control signals to a negated state and said second control signal is asserted to tristate said input/output signals for as long as said mode signal is in said asserted state, (ii) when said mode signal transitions from said asserted state to said negated state while said reset signal remains in said asserted state, said first control signal is negated to no longer force any of said output control signals a negated state; and (iii) when said reset signal transitions from said asserted state to said negated state while said mode signal is in said asserted state, said second control signal is asserted to cause said input/output signals to remain tristated until said reset signal is again received in said asserted state.

2. A reset circuit as in claim 1, wherein said second input means comprises a circuit for holding a state of said mode signal.

3. A reset circuit as in claim 1 wherein said circuit for generating further comprising:

a third input means for receiving a clock signal from said logic circuit; and a synchronizing means, receiving said clock signal from said third input means and said reset signal, for providing an internal reset signal, said internal reset signal being derived by synchronizing said reset signal with said clock signal.

4. In a logic circuit having a plurality of output control signals and a plurality of input/output signals, a method comprising the steps of:

receiving a reset signal having an asserted state and a negated state;

receiving a mode signal having an asserted state and a negated state; and (i) when said reset signal is in said asserted state and said mode signal is in said asserted state, asserting a first control signal to force each of said output control signals to a negated state and asserting a second control signal to cause said input/output signals to be tristated, for as long as said mode signal is in said asserted state; (ii) when said mode signal transitions from said asserted state to said negated state while said reset signal is in said asserted state, said first control signal is negated to no longer force each of said output control signals to a negated state; and (iii) when said reset signal transitions from said asserted state to said negated state and said mode signal is in said asserted state, asserting said second control signal to cause said input/output signals to remain tristated until said reset signal is again received in said asserted state.

5. A method as in claim 4, wherein said step of receiving a mode signal comprises the step of receiving and holding a value representing the state of said mode signal.

6. A method as in claim 4, wherein said step of receiving a mode signal comprises the step of providing a terminal used, when said reset signal is in said negated state, for carrying a signal other than said mode signal.

7. A method as in claim 4, said disabling step further comprising the steps of:

receiving a clock signal from said logic circuit; and providing an internal reset signal, said second reset signal being derived by synchronizing said reset signal with said clock signal.

8. A reset circuit as in claim 1, wherein said asserted state of said reset signal indicates the beginning of a reset period, said circuit for generating comprises a latch circuit receiving said mode signal and said reset signal, said latch circuit latching said mode signal when said reset signal transitions from said asserted state to said negated state, said latched mode signal, when in said asserted state, forces each of said output control signals to a negated state until said asserted state of said reset signal is next received.

9. A method as in claim 4, wherein said asserted state of said reset signal indicates the beginning of a reset period, said steps of asserting said second control signal comprises the steps of:

latching said mode signal, when said reset signal transitions from said asserted state to said negated state, and tristating said input/output signals until said asserted state of said reset signal is next received, if said latched mode signal is at said asserted state.

* * * * *